(12) United States Patent
Tan et al.

(10) Patent No.: US 9,493,022 B2
(45) Date of Patent: Nov. 15, 2016

(54) METHODS AND APPARATUS FOR HIGH-THROUGHPUT FORMATION OF NANO-SCALE ARRAYS

(75) Inventors: Christine P. Tan, Singapore (SG); David M. Lin, Ithaca, NY (US); Harold G. Craighead, Ithaca, NY (US)

(73) Assignee: Cornell University, Ithaca, NY (US)

( * ) Notice: Subject to any disclaimer, the term of this patent is extended or adjusted under 35 U.S.C. 154(b) by 733 days.

(21) Appl. No.: 13/389,113

(22) PCT Filed: Aug. 5, 2010

(86) PCT No.: PCT/US2010/044493
§ 371 (c)(1),
(2), (4) Date: Apr. 5, 2012

(87) PCT Pub. No.: WO2011/017487
PCT Pub. Date: Feb. 10, 2011

(65) Prior Publication Data
US 2012/0180676 A1     Jul. 19, 2012

Related U.S. Application Data

(60) Provisional application No. 61/231,570, filed on Aug. 5, 2009, provisional application No. 61/247,254, filed on Sep. 30, 2009.

(51) Int. Cl.
*B41M 3/00* (2006.01)
*B81C 1/00* (2006.01)

(52) U.S. Cl.
CPC .......... *B41M 3/006* (2013.01); *B81C 1/00031* (2013.01); *B81C 2201/0184* (2013.01); *B81C 2201/0187* (2013.01)

(58) Field of Classification Search
CPC ............ B41M 3/006; B81C 2201/0184; B81C 2201/0185; B81C 2201/0187; H05K
(Continued)

(56) References Cited

U.S. PATENT DOCUMENTS 6,559,474 B1    5/2003    Craighead et al.
7,175,876 B2    2/2007    Free et al.
(Continued)

FOREIGN PATENT DOCUMENTS

EP       1 339 838 B1    10/2008
WO    WO 97/06468 A2     2/1997
(Continued)

OTHER PUBLICATIONS

Giam et al., A Self-Correcting Inking Strategy for Cantilever Arrays Addressed by an Inkjet Printer and Used for Dip-Pen Nanolithography (2008) 1666-1668, Wiley InterScience.*
(Continued)

*Primary Examiner* — Matthew G Marini
*Assistant Examiner* — Marissa Ferguson Samreth
(74) *Attorney, Agent, or Firm* — Miller, Matthias & Hull LLP (57) ABSTRACT

An apparatus for forming an array of deposits on a substrate is disclosed. The apparatus may include a stencil capable of releasable attached to the substrate and having an array of openings and at least one alignment mark. The apparatus may further include a high throughput deposition printer aligned with the stencil to form an array of deposits on the substrate. The array of deposits may be aligned with the array of openings through the at least one alignment mark and an optional alignment device. Methods of manufacturing the stencil and using it to generate multiplexed or combinatorial arrays are also disclosed.

18 Claims, 10 Drawing Sheets

(58) Field of Classification Search
CPC ............... 3/126;H05K 3/1241; H05K 1/0269; H05K 2203/0139; H05K 2203/166
USPC .................. 101/114, 123, 126, 127, 129
See application file for complete search history.

(56) References Cited

U.S. PATENT DOCUMENTS

| | | | |
|---|---|---|---|
| 7,244,598 | B2 | 7/2007 | Duffy |
| 7,458,318 | B2* | 12/2008 | Prince ........................... 101/123 |
| 2001/0046586 | A1* | 11/2001 | Chan et al. ................... 428/131 |
| 2003/0070569 | A1 | 4/2003 | Bulthaup et al. |
| 2006/0039735 | A1* | 2/2006 | Oh et al. ....................... 400/320 |
| 2006/0166218 | A1* | 7/2006 | Orth et al. ........................ 435/6 |
| 2007/0102477 | A1* | 5/2007 | Prince ............................. 228/39 |
| 2007/0147473 | A1 | 6/2007 | Wolkin et al. |
| 2007/0148416 | A1 | 6/2007 | Wolkin et al. |
| 2007/0166771 | A1 | 7/2007 | Kapur et al. |
| 2008/0176398 | A1 | 7/2008 | Jain et al. |
| 2008/0220169 | A1* | 9/2008 | Khademhosseini et al. . 427/282 |
| 2009/0197054 | A1* | 8/2009 | Chauhan et al. ........... 428/195.1 |
| 2009/0239381 | A1* | 9/2009 | Nishimi et al. ............... 438/694 |
| 2009/0260750 | A1 | 10/2009 | Nealey et al. |
| 2011/0014436 | A1* | 1/2011 | Stiles et al. ................ 428/195.1 |

FOREIGN PATENT DOCUMENTS

| | | | |
|---|---|---|---|
| WO | WO 2006/111766 A2 | 10/2006 | |
| WO | WO 2006/135261 A2 | 12/2006 | |
| WO | WO 2009/014546 A2 | 1/2009 | |
| WO | 2009/132321 | * 10/2009 | ............. G03F 7/022 |

OTHER PUBLICATIONS

Dunn et al., Challenges and solutions to ultra-high-throughput screening assay miniaturization submicroliter fluid handling (2000) S84-S91, Elsevier Science LTD.*

Fengwei et al., Mulitplexed Protein Arrrays Enabled by Polymer Pen Lithography: Addressing the Inking Challenge (2009) 7627-7629, Wiley InterScience.*

Mateu Pla-Roca et al., Addressable Nanowell Arrays Formed Using Reversibly Sealable Hybrid Elastomer-Metal Stencils, Anal. Chem. 2010, 82, 3848-3855, Biomedical Engineering Department, McGill University, and McGill University and Genome Quebec Innovation Centre, Canada.

R. N. Orth et al., Creating Biological Membranes on the Micron Scale: Forming Patterned Lipid Bilayers Using a Polymer Lift-Off Technique, Biophysical Journal vol. 85 Nov. 2003 3066-3073, Department of Biomedical Engineering, School of Applied and Engineering Physics, and Department of Microbiology and Immunology, Cornell University, Ithaca, New York 14853, United States of America.

Julie M. Goddard et al., Biopatterning for label-free detection, Colloids and Surfaces B: Biointerfaces 76 (2010) 375-380, Sibley School of Mechanical and Aerospace Engineering, Cornell University, Ithaca, NY 14853, USA.

Sun Min Kim et al., Fabrication of biological arrays by unconventional lithographic methods, Frontiers in Bioscience S1, 406-419, Jun. 1, 2009, Department of Mechanical Engineering, Inha University, 253 Young Hyun-dong, Nam-gu, Incheon, 402-751, Republic of Korea.

Dylan Wright et al., Reusable, reversibly sealable parylene membranes for cell and protein patterning, Published online Aug. 29, 2007 in Wiley InterScience, Department of Chemical Engineering, Massachusetts Institute of Technology, Cambridge, Massachusetts 02139, USA.

Dylan Wright et al., Generation of static and dynamic patterned co-cultures using microfabricated parylene-C stencils, Lab Chip, 2007, 7, 1272-1279, Department of Chemical Engineering, Massachusetts Institute of Technology, Cambridge, MA, 02139, USA.

Kyoko Atsuta et al., Micro patterning of active proteins with perforated PDMS sheets (PDMS sieve), Lab Chip, 2004, 4, 333-336, Center for International Research on Micro Mechatronics (CIRMM), Institute of Industrial Science (IIS), University of Tokyo, 4-6-1, Komaba, Meguro-ku, Tokyo 153-8505, Japan.

Rohit Pal et al., Microstencils for the Patterning of Nontraditional Materials, Langmuir 2006, 22, 5392-5397, Department of Chemical Engineering, and Department of Biomedical Engineering, UniVersity of Michigan, Ann Arbor, Michigan 48109, USA.

Christine P. Tan et al., Surface Engineering and Patterning Using Parylene for Biological Applications, Materials 2010, 3, 1803-1832, Department of Biomedical Engineering, Cornell University, Ithaca, New York, NY 14853, USA.

John A. DeFranco et al, Photolithographic patterning of organic electronic materials, Organic Electronics 7 (2006) 22-28, Department of Materials Science and Engineering, Cornell University, 327 Bard Hall, Ithaca, NY 14853, USA.

Oscar Vazquez Mena, Development of Stencil Lithography for Nanopatterning and for Electronic and Biosensing Applications, Thèse No. 4567 (2009) présentée le 5 février 2010 à la Faculte Sciences et Techniques de l'Ingénieur Laboratoire de Microsystèmes 1, École Polytechnique Fédérate De Lausanne, France.

* cited by examiner

METHODS AND APPARATUS FOR HIGH-THROUGHPUT FORMATION OF NANO-SCALE ARRAYS

CROSS-REFERENCE TO RELATED APPLICATIONS

This application is a U.S. National Stage filing under 35 USC §371 of International Patent Application No. PCT/US09/44493 filed on Aug. 5, 2010, which claims priority under 35 USC §119(e) to U.S. Provisional Application Ser. No. 61/247,254 filed on Sep. 30, 2009, and U.S. Provisional Application Ser. No. 61/213,570, filed on Aug. 5, 2009.

GOVERNMENT LICENSE RIGHTS

The U.S. Government has an active license in this invention and the right in limited circumstances to require the patent owner to license others on reasonable terms as provided for by the terms of Grant No. R01DC007489-01A1, awarded by the National Institutes of Health.

BACKGROUND

1. Technical Field

Apparatus and methods for high-throughput formation of an array of deposits on a substrate with improved resolution and pattern fidelity are disclosed. In particular, this disclosure relates to the manufacture and use of a removable stencil aligned with a high-throughput deposition printer to control the location and dimension of a single, multiplexed, or combinatorial array of deposits on the substrate.

2. Description of the Related Art

Methods and apparatus for depositing arrays of substances with smaller dimensions (i.e. micro- or even nano-scales) on a substrate have been the central focus of a number of technological fields including electronics, optics, chemistry and biochemistry. In particular, biomolecular arrays with nano-scale features are useful for applications such as tissue engineering, cell cultures, and studying sub-cellular receptor-ligand interactions and intracellular processes. For example, cell behavior such as differentiation, adhesion and proliferation, can be regulated by patterned arrays of extracellular matrix (ECM) proteins with different feature shapes, sizes and spacings. Reducing the feature size of patterned ECM proteins to sub-200 nm dimension can help to elucidate the role of ECM proteins in forming focal adhesions with single-molecule resolution.

Furthermore, there is a growing interest to integrate biological and chemical functionalities with miniaturized sensor devices whereby accurate spatial positioning and alignment are crucial, such as nano-wire sensors, chemical field-effect transistors, nano-electromechanical sensors, and diffraction based antibody gratings. The diversity of protein molecules and their combinations present in nature requires the highly multiplexed capability of arrays to study the plethora of possible antagonistic and synergistic interactions between receptors and ligands. Hence, it is typical for hundreds or thousands of different biomaterial samples and their replicates to be patterned on a large area array and afterwards, allow for biomolecular ligands or cells to interact with the patterned surface.

Recent advances in printing and lithography have enabled the generation of patterned arrays with smaller features, some even with nano-scale resolutions. Exemplary array patterning techniques may include micro-contact printing (µCP) and atomic-force microscopy (AFM) based methods such as dip-pen lithography (DPN). While DPN is able to achieve nano-scale resolution down to tens of nm, the method is not easily scalable to print thousands of different biomolecules in a high-throughput fashion. Moreover, the final shape and size of deposits printed using DPN are controlled by surface hydrophobicity and chemistry. DPN may require extended length of time required to pattern large areas >1 $cm^2$ even if multiple pens are used. µCP, on the other hand, may generate replicate arrays more rapidly but the elastomeric polymer stamps can deform with pressure and swell in aqueous conditions, resulting in relatively non-uniform nano-scale features. Additionally, µCP may not be suitable for generating arrays of superimposed depositions of multiple different types of samples as repeated alignment of elastomeric stamps with nano-scale precision may be difficult to achieve. Finally, the dimension, resolution, shape and reproducibility of deposits printed using current conventional printing methods depend on many factors such as surface chemistry, hydrophobicity and printing buffer and thus there is a need for robust and efficient printing apparatus and methods with better resolution and pattern fidelity.

Use of a polymer stencil in the deposition of micro-scale arrays is also known in the art. Specifically, a pre-defined array of micro-scale openings may be created photolithographically in a photoresist mask, and may be transferred into the polymer stencil through an etching process, which in turn is placed on the substrate for deposition of biomolecular samples through the micro-scale openings. Removal of the polymer stencil leaves the array of samples with defined micro-scale features on the substrate. Exemplary polymeric materials for making the stencil includes parylene, which is biocompatible and has been used as a template for patterning biomolecular arrays with features >1 µm, such as creating large area arrays of single-cells, proteins, nucleic acids, and lipid bilayers.

However, existing polymer stencil technologies typically rely on bath application of one type of sample onto the whole surface. Moreover, existing polymer stencil technologies may also be limited by the dimensions of the openings created in the stencil. Finally, high-throughput deposition of multiplexed combinatorial samples using polymer stencil technologies has yet to be developed.

SUMMARY OF THE DISCLOSURE

This disclosure generally relates to methods and apparatus for high-throughput deposition of an array of one or more substances on a substrate with improved resolution and pattern fidelity, and particularly relates to the make and use of a removable stencil with an array of predefined openings to control the location and dimension of the substances deposited on the substrate. The disclosed apparatus and methods may reproducibly refine the imperfect deposits originally generated by the printer into well-defined deposits with improved resolution and pattern fidelity through the use of the removable stencil.

According to one aspect of this disclosure, an apparatus for forming an array of deposits on a substrate is disclosed. The apparatus includes a stencil releasably attached to the substrate and having an array of openings and at least one alignment mark. The apparatus further includes a high throughput deposition printer aligned (e.g. through an optional alignment device) with the stencil to form an array of deposits on the substrate. The array of deposits may be aligned with the array of openings through the at least one alignment mark.

According to another aspect of this disclosure, a method for generating an array of deposits on a substrate is disclosed. The method includes the steps of placing over the substrate a polymer stencil having an array of openings and at least one alignment mark; aligning a high throughput deposition printer to the polymer stencil through the at least one alignment mark; generating a first array of deposits on the substrate through the array of openings by the printer; and removing the polymer stencil from the substrate.

According to another aspect of this disclosure, a method for generating a combinatorial array of deposits on a substrate is disclosed. The method includes the steps of placing over the substrate a polymer stencil having an array of openings; generating a first array of deposits on the substrate through the array of openings; generating a second array of deposits on the substrate through the array of openings; and removing the polymer stencil from the substrate. At least one of the first and second arrays is multiplexed and the first and second arrays of deposits may be capable of interacting with each other. As used in this disclosure, the term "multiplexed array" refers to a layer of array of deposits in which at least two deposits are different from each other in terms of their chemical and/or biological properties. Accordingly, the term "uniplexed" refers to a layer of array of deposits in which all deposits are identical in terms of their chemical and/or biological properties.

According to another aspect of this disclosure, a method for forming a polymer stencil is disclosed. The method may include the steps of providing an etching mask over a polymer layer, forming at least one opening in the etching mask by a first etching process, and forming at least one opening in the polymer layer by a second etching process. The etching mask may include a first mask and a second mask positioned between the polymer layer and the first mask. The second mask may be more resistant to the second etching process that the first mask.

Other advantages and features of the disclosed apparatus and methods will be described in greater detail below. It will also be noted here and elsewhere that the apparatus or method disclosed herein may be suitably modified to be used in a wide variety of applications by one of ordinary skill in the art without undue experimentation.

BRIEF DESCRIPTION OF THE DRAWINGS

For a more complete understanding of the disclosed method and apparatus, reference should be made to the embodiments illustrated in greater detail in the accompanying drawings, wherein.

It should be understood that the drawings are not necessarily to scale and that the disclosed embodiments are sometimes illustrated diagrammatically and in partial views. In certain instances, details which are not necessary for an understanding of the disclosed apparatus or method which render other details difficult to perceive may have been omitted. It should be understood, of course, that this disclosure is not limited to the particular embodiments illustrated herein.

DETAILED DESCRIPTION OF THE DISCLOSURE

Figure 1:
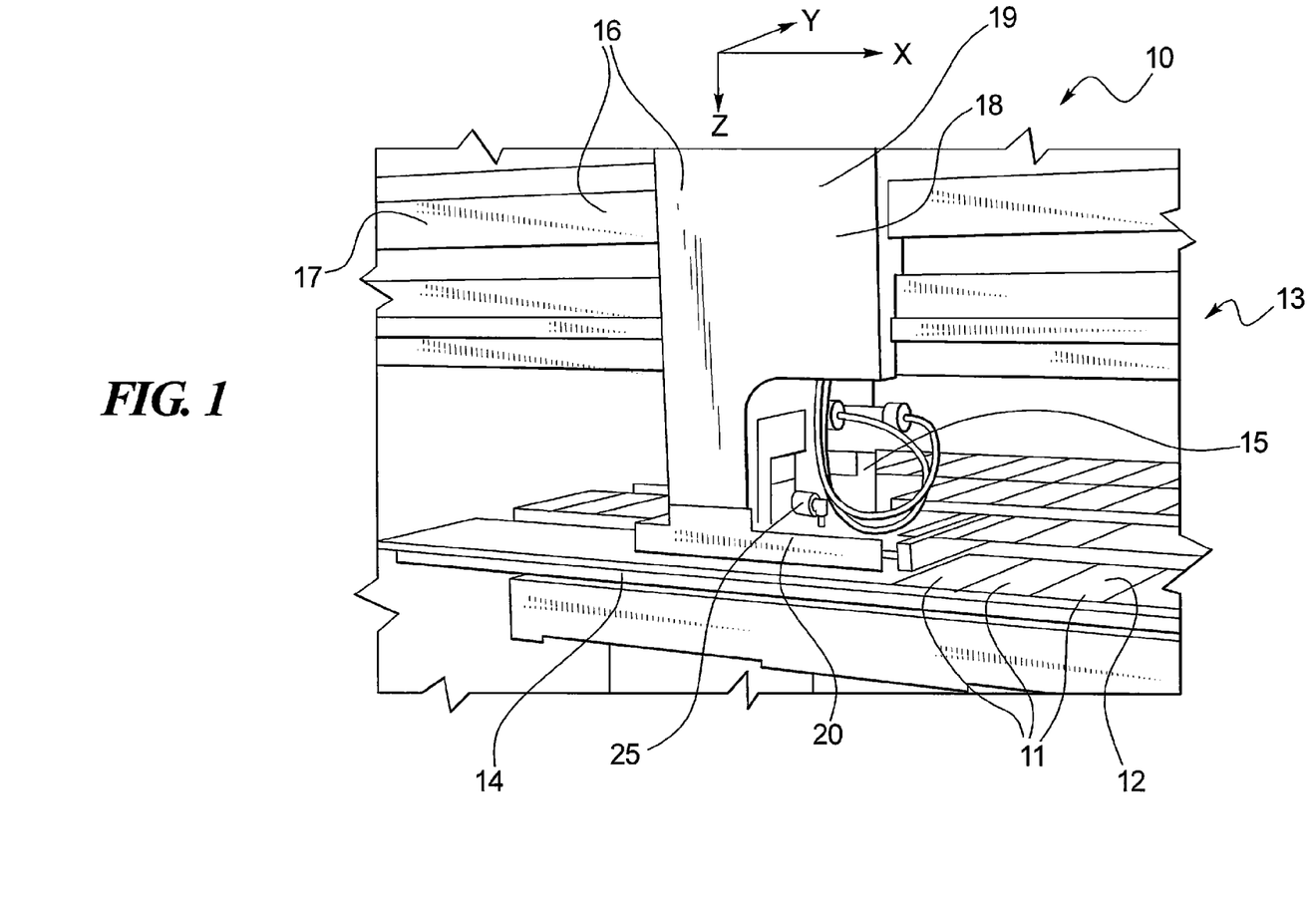
FIG. 1 is a photographic view of an exemplary apparatus for forming an array of deposits on a substrate according to one aspect of this disclosure.

Referring now to FIG. 1, an apparatus 10 for forming an array of deposits on a substrate 11 is illustrated as including a stencil 12 releasably attached to the substrate 11 and an exemplary high throughput deposition printer 13, the combination of which generates the array of deposits on the substrate 11 with improved resolution. The printer 13 may include a support plate 14 upon which one or more substrates 11 are securely rested. The printer 13 may further include a print head 15 adapted to load and deposit a plurality of different samples on the substrate 11. The print head 15 may be mounted on a positioning device 16 so that samples loaded on the print head 15 can be deposited to predefined locations on the substrate 11.

The positioning device 16 may include a position rail 17 extending in an X-direction and movable in a Y-direction parallel to the support plate 14. The positioning device 16 may also include a position arm 18 having a first end 19 attached to, and movable in the X-direction along, the position rail 17 and a second end 20 upon which the print head 15 is mounted. The position rail 17 and position arm 18 may be operatively connected to one or more motors (not shown) and controlled by a processor (not shown) so that the position of the print head 15 relative to the substrate 11 on the support plate 14 can be precisely controlled.

One non-limiting example of the printer 13 suitable for use in this disclosure is a high-throughput Marathon Inkjet Microarrayer printer (provided by ArrayJet, Midlothian Innovation Centre, Pentlandfield, Roslin, EH25 9RE, Scotland—UK), which is capable of generating deposits directly on the substrate with micrometers resolution. However, the sizes and shapes of the deposits can vary from spot to spot, depending on factors such as printing buffer conditions and surface chemistry/hydrophobicity. Deposits with smaller feature sizes, such as nanometer resolutions, may be difficult to achieve by direct inkjet printing.

Figure 2:
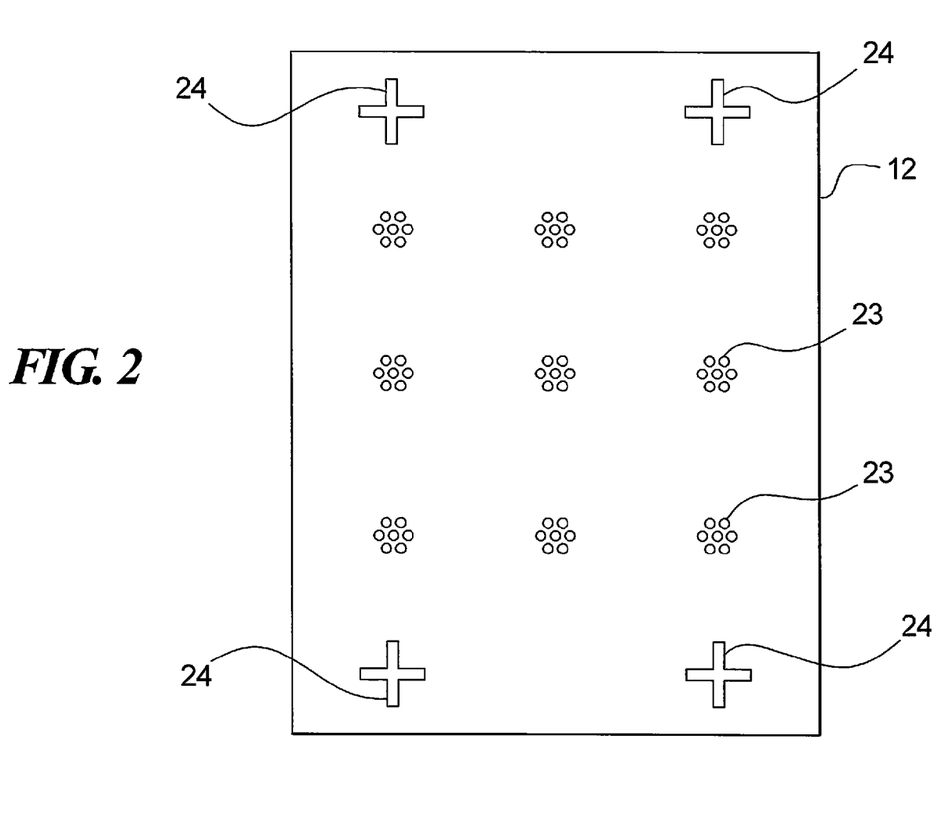
FIG. 2 is a schematic illustration of the stencil in FIG. 1.

To improve the reproducibility and pattern fidelity of the deposits generated by the high-throughput printer 13, and/or to achieve deposits with nano-scale features, the polymer stencil 12 is provided on the top surface of the substrate 11 during printing and removed from the substrate once the deposits are formed. The average diameter of the original printed deposit may be larger than the average diameter of the opening or the array of openings in the polymer stencil, such that the printed deposit completely covers the opening or the array of openings. A non-limiting example of the polymer stencil 12 is illustrated in FIG. 2 as including an array of openings 23 and at least one alignment mark 24. In one embodiment, the openings 23 are micrometer-sized but have an average diameter of less than the average diameter of the deposits formed by the printer 13. In another embodiment, the openings are nanometer-sized (e.g. having an average diameter of no more than about 1 µm, 200 nm, or even 100 nm). For nano-scale openings, the depth/diameter ratio of the opening may sometimes affect the resolution and fidelity of the disclosed methods and apparatus. For example, it has been found that, in some embodiments, good resolution and high fidelity may be achieved by stencils with nano-scale openings having a depth/diameter ratio of no more than 5. The openings 23 may be circular, triangular, rectangular, square, oval, diamond, elongated, or any suitable shapes and dimensions in light of this disclosure.

As illustrated in FIG. 2, the polymer stencil 12 includes at least one alignment mark 24 to facilitate the alignment between the stencil 12 and the printer 13. The non-limiting exemplary stencil 12 illustrated in FIG. 2 includes four alignment marks 24 at all four corners of the stencil 12. However, the stencil 12 may include only two alignment marks at the two upper or two lower corners. Alternatively, the two alignment marks may also be provided on the upper and lower left corner, upper and lower right corners, or at diagonal corners of the stencil 12. In some embodiment, the stencil may even include only one alignment mark, such as an L-shaped slit at one of the corners with its two ends serving as two alignment coordinates. It is to be understood that the shape, number, and dimension of the openings and alignment mark is not limited to the examples disclosed herein.

Turning back to FIG. 1, the disclosed apparatus 10 may further optionally include an alignment device 25 operatively associated with the polymer stencil 12 and the deposition printer 13 to visualize, detect, sense, or otherwise facilitate the alignment between the stencil 12 and printer 13. In one non-limiting example, the alignment device 25 may be an imagining device such as a microscopic camera or an atomic force microscope (AFM). Other suitable optical, electric, electromagnetic, and/or digital alignment devices may also be used in light of this disclosure. It is to be understood that the use of the alignment device 25 is optional and visual alignment without any alignment device may be sufficient in some embodiments.

Figure 3:
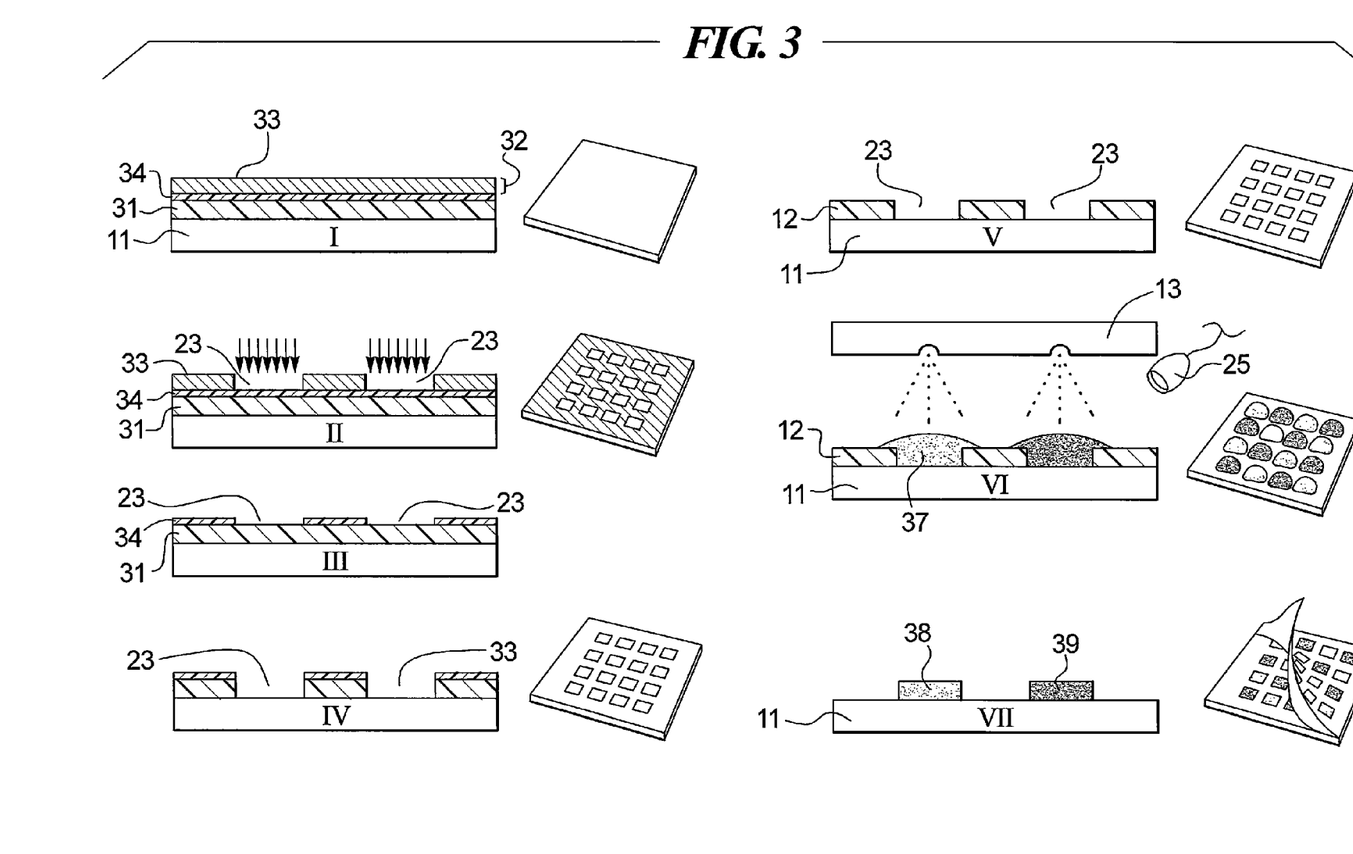
FIG. 3 is a schematic illustration of a method for manufacturing the stencil in FIG. 1 and for using the stencil to deposit an array of biomolecular samples on a substrate according to another aspect of this disclosure.

FIG. 3 illustrates a non-limiting example of the manufacturing process of the stencil 12 and the method of using same to generate an array of deposits in a high-throughput and precision-controlled manner, schematically illustrated as having steps I-V. In step I, an etching mask 32 is provided on a polymer layer 31, which in turn is provided on the substrate 11. In one embodiment, the substrate 11 is an oxidized silicon wafer. However, other substrates, such as microscope slides and coverslips, may also be used. Similarly, a wide variety of polymer materials can be used to make the polymer layer 31. In one embodiment, the polymer layer 31 is made of parylene (e.g. parylene-C) and the polymer layer 31 is vapor coated on the substrate 11.

One feature of the parylene stencils made by the disclosed method is that they are substantially pinhole-free and relatively inert to chemical reactions. Another feature of the parylene stencils made by the disclosed method is that they exhibit limited or no swell in aqueous solutions, which may make them suitable for patterning relatively large area with uniform arrays of biomolecules with improved pattern fidelity. Moreover, it is contemplated that the parylene stencils made by the disclosed method may be used to pattern biomolecular arrays under hydrated conditions, which preserves the conformation and functionality of those biomolecules that are sensitive to moisture. It is to be understood that other polymer materials, natural or synthetic, may also be used instead of, or in addition to, the parylene material disclosed above.

The etching mask 32 may include a first mask 33 and a second mask 34 positioned between the polymer layer 31 and the first mask 33. In one embodiment, the first mask 33 may include an electron beam resist material (e.g. ZEP520 resist by Zeon Chemicals, 4111 Bells Lane, Louisville, Ky.). The second mask 34 may include a metal material, such as aluminum. The second mask 34 may be deposited on the polymer layer 31 by thermal or electron beam evaporation, and the first mask 33 may be formed on the second mask 34 by spin-coating. It is to be understood that the coating and deposition methods disclosed above are exemplary and should not be interpreted as limiting the scope of this disclosure.

In order to form nano-scale openings on the polymer layer 31, the openings 23 are first formed in the etching mask 32 through a first etching process, as illustrated in FIG. 3 (step II). In one embodiment, the first etching process comprises electron beam lithography (EBL). One feature of EBL is that it enables convenient and high-throughput creation of well-defined nano-scale arrays of openings on the first mask. However, other methods, such as nano-imprint lithograph ("NIL") may also be used to create the openings in light of this disclosure so long as the desirable resolutions can be achieved. In some cases, NIL may achieve lithographic resolution similar to EBL, and may pattern the same area in a shorter time with lower costs.

In step III, the array of openings 23 formed in the first mask 33 may be further transferred to the second mask 34. When the second mask 34 is made of a metal, the array of openings 23 may be created in the second mask 34 through reactive-ion etching. Thus, in some embodiment, the first etching process may include EBL in the first mask 33 and reactive-ion etching in the second mask 34 (steps II and III). Further, when the second mask 34 is made of a metal, a metal oxide may be formed on the surface of the second mask 34 and affect the reactive-ion etching of the second mask 34, in which case the first etching process may further include an additional step of applying high voltage (e.g. 450V) on the second mask 34 to remove the metal oxide thereon. As indicated in FIG. 3, the first mask 33 may also be removed during the reactive-ion etching of the second mask 34.

In step IV, the array of openings 23 formed on the second mask 34 is transferred to the polymer layer 31 through a second etching process. When the polymer layer 31 is made of parylene-C, the second etching process may also include reactive-ion etching, albeit at a less harsh condition than the reactive-ion etching of the second mask 34, to preserve the structural integrity of the well-defined array of openings on the second mask 34. After the array of the openings 23 are transferred to the polymer layer 31 (now the polymer stencil 12), the second mask 35 may be removed from the polymer stencil 12 in step V, leaving only the polymer stencil 12 on the substrate 11. Because the second mask 34 is more resistant to the second etching process than the first masks 33, the array of openings 23 formed with high-resolution (e.g. with nano-scale features) may be transferred to the polymer stencil 12 with high fidelity, as described with greater details in the examples below.

In a non-limiting example of the method disclosed above, a thin layer of parylene-C (obtained from Uniglobe Kisco, 707 Westchester Avenue, Suite 207, White Plains, N.Y. 10604, USA) was conformally vapor coated onto a 4" oxidized silicon wafer using a Parylene Labcoater (obtained from Specialty Coating Systems, 7645 Woodland Drive, Indianapolis, Ind. 46278, USA). Thereafter, an aluminum thin film (e.g. 15 nm) was thermally evaporated on top of the parylene. Zeon ZEP-520 resist was spun to a 100 nm thickness on top of the aluminum film, baked at 90° C., and exposed by electron beam lithography (EBL) using the JEOL JBX-9300FS to generate an array of openings with nano-scale features.

Figure 4:
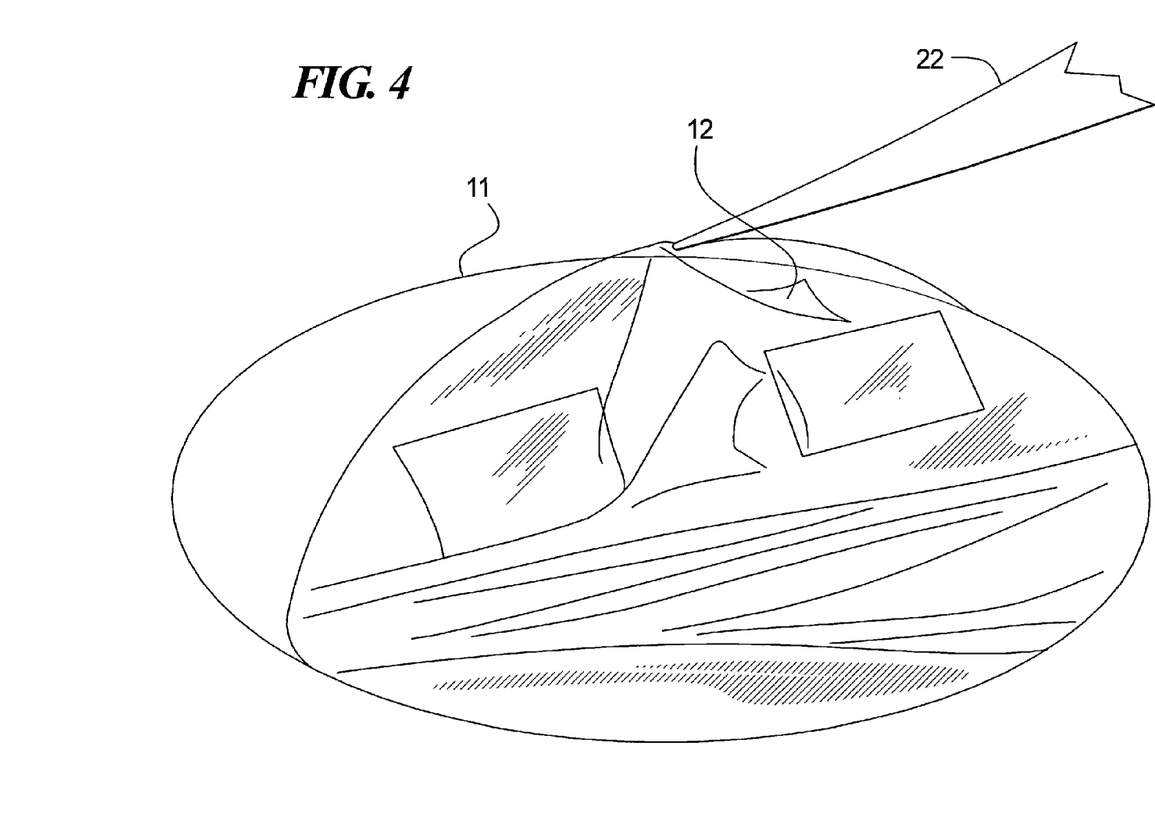
FIG. 4 is a photographic illustration of a polymer stencil made by the method in FIG. 3.

The resist was then developed in n-amyl acetate for 45 seconds and rinsed for 30 seconds in methyl isobutyl ketone and 2-isopropanol. The array of openings in the resist was transferred into the aluminum film using reactive ion etching with $Cl_2/BCl_3/CF_4$ chemistry in a PlasmaTherm® 740 etcher. Finally, the nano-scale openings were transferred into the parylene using the patterned aluminum film as a hard etch mask and oxygen plasma reactive ion etching with the Oxford PlasmaLab® 80+ etcher. The aluminum film was dissolved in MIF300 developer (obtainable from e.g. Micro-Chem, 90 Oak St., Newton, Mass. 02464, USA), leaving the parylene stencil on the wafer. As illustrated in FIG. 4, the parylene stencil 12 can be mechanically removed from the wafer 11, such as by using a pair of tweezers 22.

Figure 5:
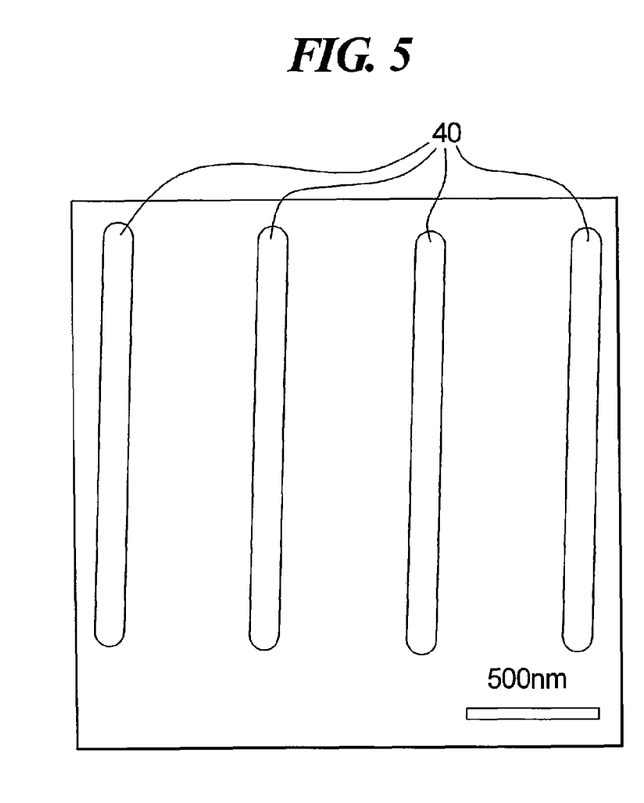
FIG. 5 is an atomic-force microscopic ("AFM") image of an array of nano-scale openings of a first dimension created in the polymer stencil shown in FIG. 4.
Figure 6:
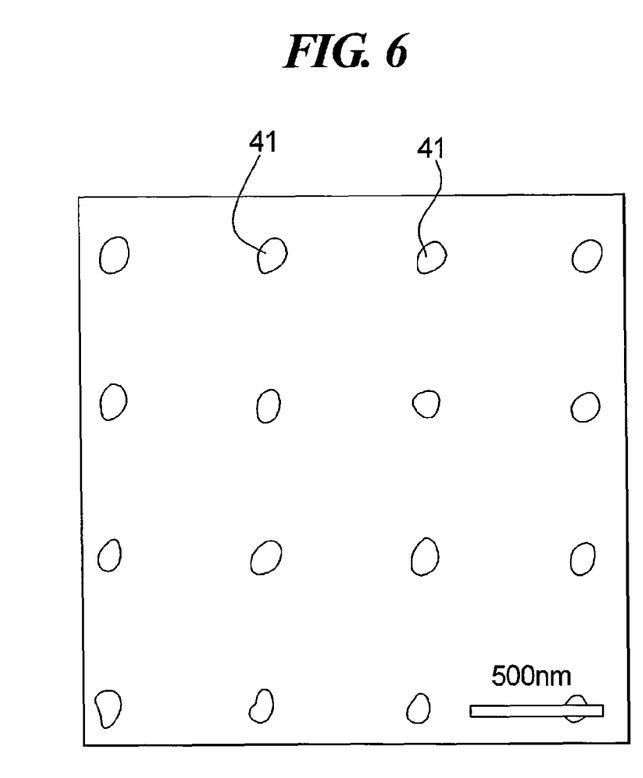
FIG. 6 is an AFM image of an array of nano-scale openings of a second dimension created in the polymer stencil shown in FIG. 4.

Turning now to FIG. 5, the array of openings 23 generated in the above-described example may include elongated slits 40 with an average width of no more than about 200 nm as confirmed by the AFM images. Moreover, as shown in FIG. 6, the array of openings 23 may also include generally circular or oval-shaped holes 41 with an average diameter of no more than about 200 nm or even less than about 100 nm. To further characterize the nano-scale openings generated in the above-described example, the parylene stencil 12 was subjected to tapping mode AFM using a Digital Instruments 3100 system with a silicon TESP tip at scan speeds of 0.5-2 Hz. The AFM images were post-analyzed using the WSxM v3.0 freeware from Nanotec Electronica, Centro Empresarial Euronova 3, Ronda de Poniente 12, Planta $2^a$, oficina C, E28760 Tres Cantos, Madrid, Spain. The full-width-at-half-maximum (FWHM) of the cross-sectional profile of a feature was reported as its width to minimize the effect of tip convolution. The average width for the slits 40 and the average diameter for the holes 41 were 180±13 nm and 90±18 nm, respectively.

Thus, the disclosed method is capable of generating an array of openings with nano-scale resolution (e.g. no more than about 200 nm) in a high-throughput nanofabrication process, an achievement heretofore unknown. In particular, the use of the second mask may promote the transferring of openings with nano-scale features from the first mask 33 to the polymer stencil 12 with high fidelity that is not available to existing single-mask processes. Without wishing to be bound by any particular theory, it is contemplated that such high fidelity may be at least partially attributed to the second mask being more resistant to the etching condition of the polymer layer. In the above-described process, for example, the aluminum mask may form a stable oxide layer in the presence of oxygen. This aluminum oxide layer maintains etch anisotropy, which prevents lateral widening of the features during pattern transfer into the parylene layer. Although such lateral widening may be insignificant during existing processes of generating micrometer-sized openings in parylene with a photoresist or electron beam resist etch mask, it may prevent accurate transferring of nanometer-sized openings from the resist material to the parylene layer. Moreover, in some cases, the oxide layer may also prevent the aluminum layer from being etched efficiently by the chlorine etch chemistry during the pattern transfer from the resist layer into the aluminum mask. To remove the aluminum oxide layer, a high power of 450V may be applied to the aluminum mask before the openings are transferred into the aluminum mask. This step may also facilitate the removal of the resist layer. Again, without wishing to be bound by any particular theory, it is contemplated that the resolution and size of the nano-scale openings in the parylene stencil generated by the disclosed method may be a function of the etch selectivity, anisotropy, and/or aspect ratio of the etching steps in the nanofabrication.

Turning back to FIG. 3, the polymer stencil 12 may be used to deposit biomolecular samples 37 on the substrate 11, as illustrated in steps VI and VII. Specifically, the deposition printer 13 (e.g. inkjet printer) may be positioned over the stencil 12 so that the deposits from the printer 13 are aligned to the array of openings 23 in the stencil 12 through the at least one alignment mark 24 (facilitated by the optional alignment device 25). Biomolecular samples 37, such as proteins, may be then deposited on the stencil 12 by the printer 13 to cover the array of openings 23. Removal of the polymer stencil 12 leaves the biological samples 27 on the substrate 11 with high pattern fidelity. As illustrated in FIG. 3, two or more biomolecular sample deposits (38, 39) may be different in terms of their chemical and/or biological properties (i.e. the array of deposits may be multiplexed) in some embodiments.

As a non-limiting example, a patterned nano-array of fibronectin was deposited on a substrate using the parylene stencil 12 with high fidelity. Specifically, human fibronectin (obtained from Sigma-Aldrich) was dissolved in deionized water and diluted in phosphate buffered saline to 10 µg/mL. The diluted fibronectin was manually spotted onto the parylene template, incubated for 2 hours, and rinsed with water to remove excess unbound fibronectin. The parylene stencil was peeled off with tweezers under water to define an array of nanoscale fibronectin features. The array was kept in hydrated conditions throughout the patterning to preserve the 3D conformation and functionality of the protein.

Figure 7:
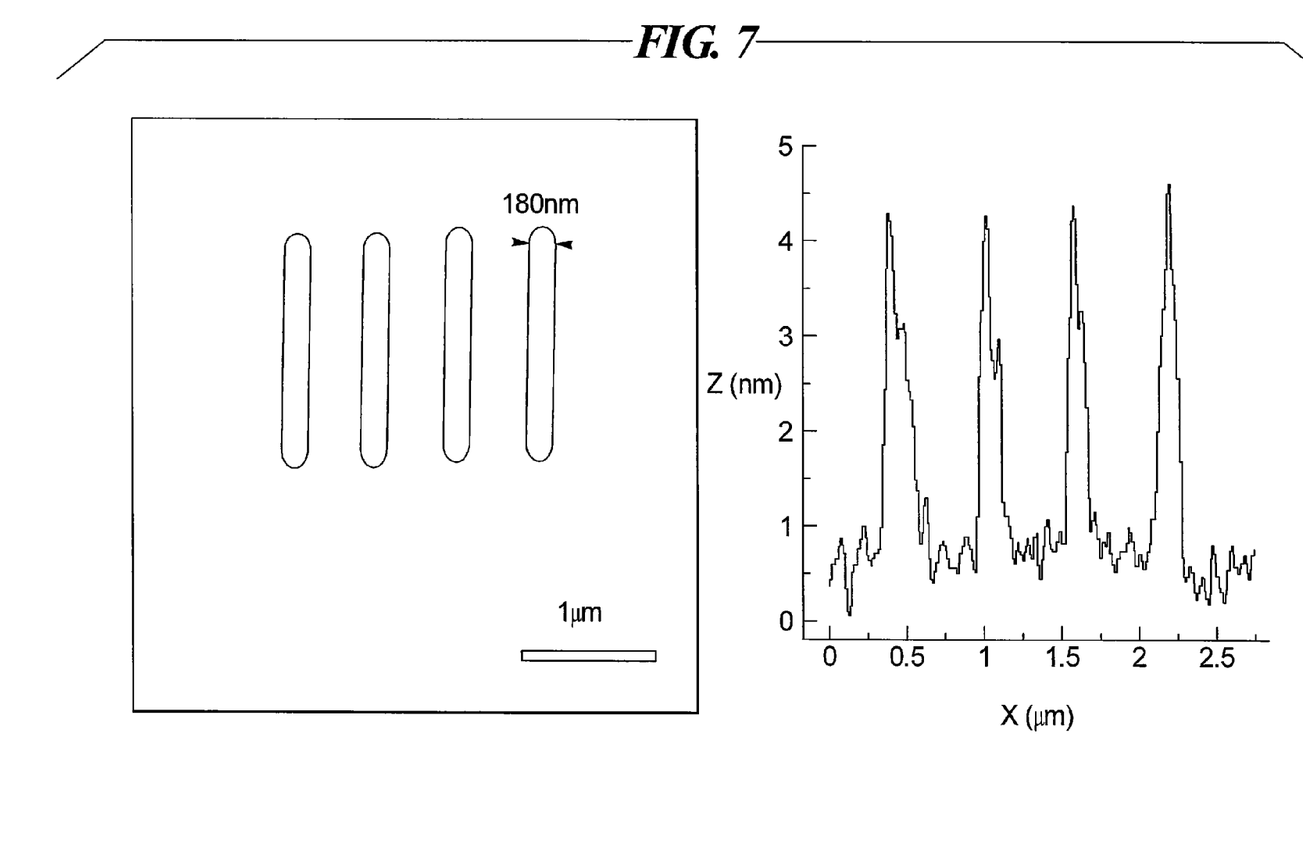
FIG. 7 is an AFM image and cross-sectional profile of an array of biomolecular sample deposited on the substrate through the array of openings shown in FIG. 5.
Figure 8:
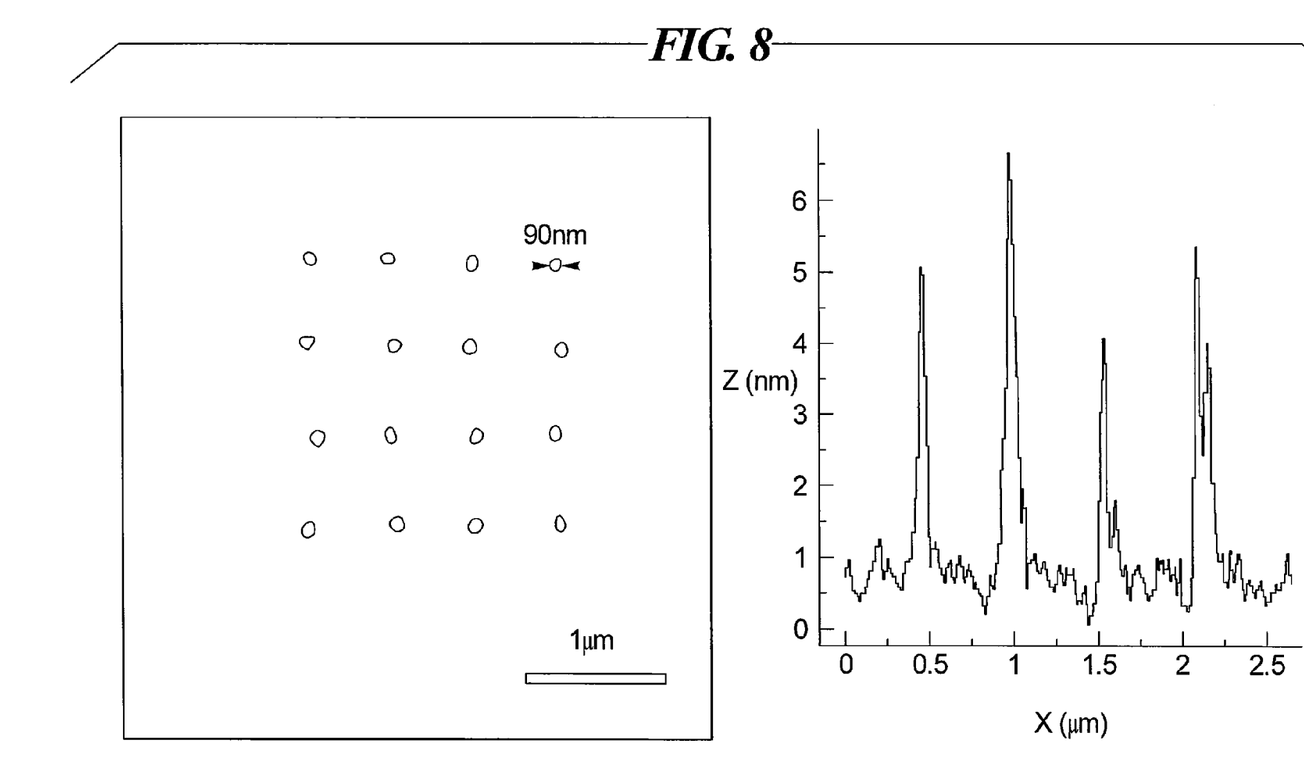
FIG. 8 is an AFM image and cross-sectional profile of an array of biomolecular sample deposited on the substrate through the array of openings shown in FIG. 6.

As illustrated in FIGS. 7-8, the fibronectin array exhibited high fidelity patterns with lines 50 having 180 nm widths and spots 51 having 90 nm diameters, a resolution heretofore unknown. In addition to the nanofabrication method disclosed above, the chemical inertness of parylene and its resistance to swelling in hydrated environments may also have contributed to the high resolution achieved. Furthermore, as illustrated in FIGS. 6-7, the cross-sectional height profile of the fibronectin features exhibited a relatively uniform height distribution of 4-5 nm.

Figure 9:
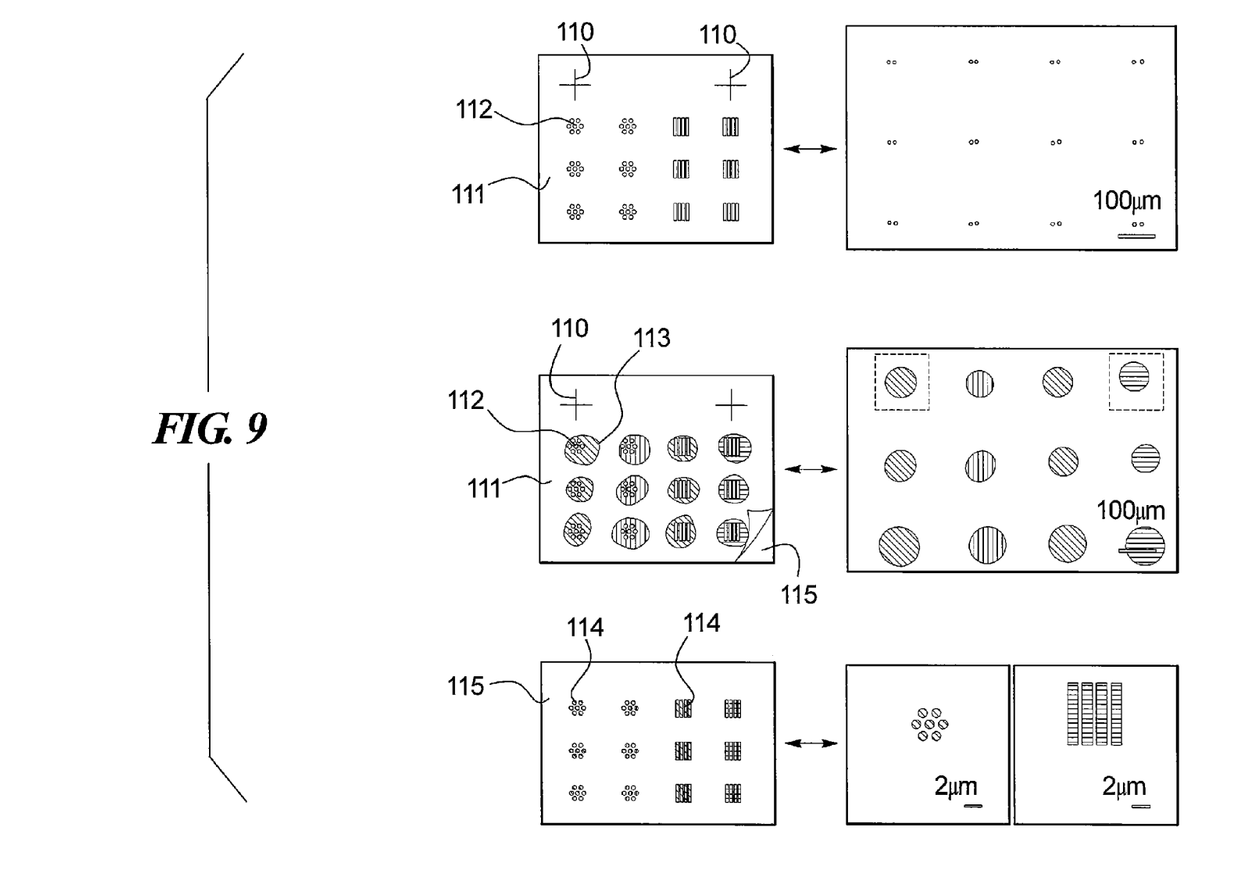
FIG. 9 is a schematic and corresponding photographic illustration of the use of the disclosed stencil to generate a multiplexed array of biomolecular deposits.

FIG. 9 graphically illustrates a non-limiting example of combining the high-throughput, multiplexing capabilities of high throughput deposition printing with the nanopatterning ability of the deposit printing process described above. Various antibodies tagged with different fluorophores, such as Alexa Fluor 488 goat anti-rabbit IgG, Alexa Fluor 555 goat anti-rabbit IgG, and Alexa Fluor 647 goat anti-mouse IgG, were diluted in 1:100 v/v in 50% glycerol printing buffer. Each diluted antibody was loaded into a well in a microplate and then printed with alignment using a Marathon Inkjet Microarrayer printer from Arrayjet.

As schematically illustrated in FIG. 9 (left column), alignment marks 110, such as micro-scale crosses with line widths of 20 μm and lengths of 100 μm created in the parylene stencil 111, were used to locate and align the positions of the nano-scale openings 112 in the parylene stencil 111 using a high magnification microscope camera. Although a visual alignment accuracy of 20 μm was achieved in this example, higher accuracies may be readily available using a camera with higher magnification or other alignment devices such as AFM or interferometry devices known in the art. The coordinates of the nano-scale openings were calculated and used to program the inkjet printer for aligned printing of the sample spots 113 onto the openings 112 in the parylene stencil 111. It is to be understood that although inkjet printer was used in this example, other printing technologies, such as quill-pin spotting and contact printing, may also be used. As shown in FIG. 9, each printed sample spot 113 covered a corresponding nano-opening 112 in the parylene stencil 111. For better visualization of the samples, three pre-assembled filter cubes (obtained from Chroma and Omega Optical) were used to collect the fluorescence images, with each cube designed to image one specific fluorophore. The images collected from the three fluorescence channels were overlaid using ImageJ, a public domain, Java-based image processing program developed at the National Institutes of Health. The final merged image was pseudo-colored—Alexa Fluor 488 (green), Alexa Fluor 555 (blue), and Alexa Fluor 647 (red)—to illustrate the different antibodies patterned.

As illustrated in FIG. 9 (right column), after the parylene stencil 111 was mechanically peeled away, uniformly patterned multi-component antibodies arrays 114 with different nano-scale feature shapes and sizes was left on the substrate 115. In particular, arrays of 600 nm lines and 600 nm spots of samples were patterned in this example, despite inconsistencies in the original inkjet spot morphology and size. Thus, the process disclosed herein may be used to clean up imperfect inkjet-printed sample spots by transforming them into well-defined deposits with high-resolution features through the application of the disclosed parylene stencil. It is to be understood that the disclosed process is not limited to nano-scale features, and can also be used to pattern micro-scale features, so long as the originally printed spot is larger than the openings in the parylene stencil. The use of alignment marks in the stencil enables multiple species to be reproducibly patterned with nano-scale resolution onto a substrate. The disclosed process may also extend the resolution of regular inkjet printing from micrometers to tens of nm (comparable to DPN), while capable of being scaled up to print thousands of multiplexed components in a high throughput fashion. For example, the spacing between each set of patterned samples in the above-described example is limited by the 70-100 μm diameter of the inkjet-printed spot. According to this density, over 20,000 different biomolecular samples may be deposited on a 1 cm×2 cm substrate, which may be used for immunoassays, molecular diagnostics, and cytokines screening.

In a further refinement, two or more layers of array of deposits that are capable of interacting with each other may be superimposed to generate combinatorial arrays of increasing complexity when at least one of the layers is multiplexed, another feature heretofore unknown. The interaction may include, but is not limited to chemical reactions, receptor-ligand bindings, enzyme-substrate interactions, interactions that generate fluorescence, chemiluminescence or color change, and combinations thereof.

Figure 10:
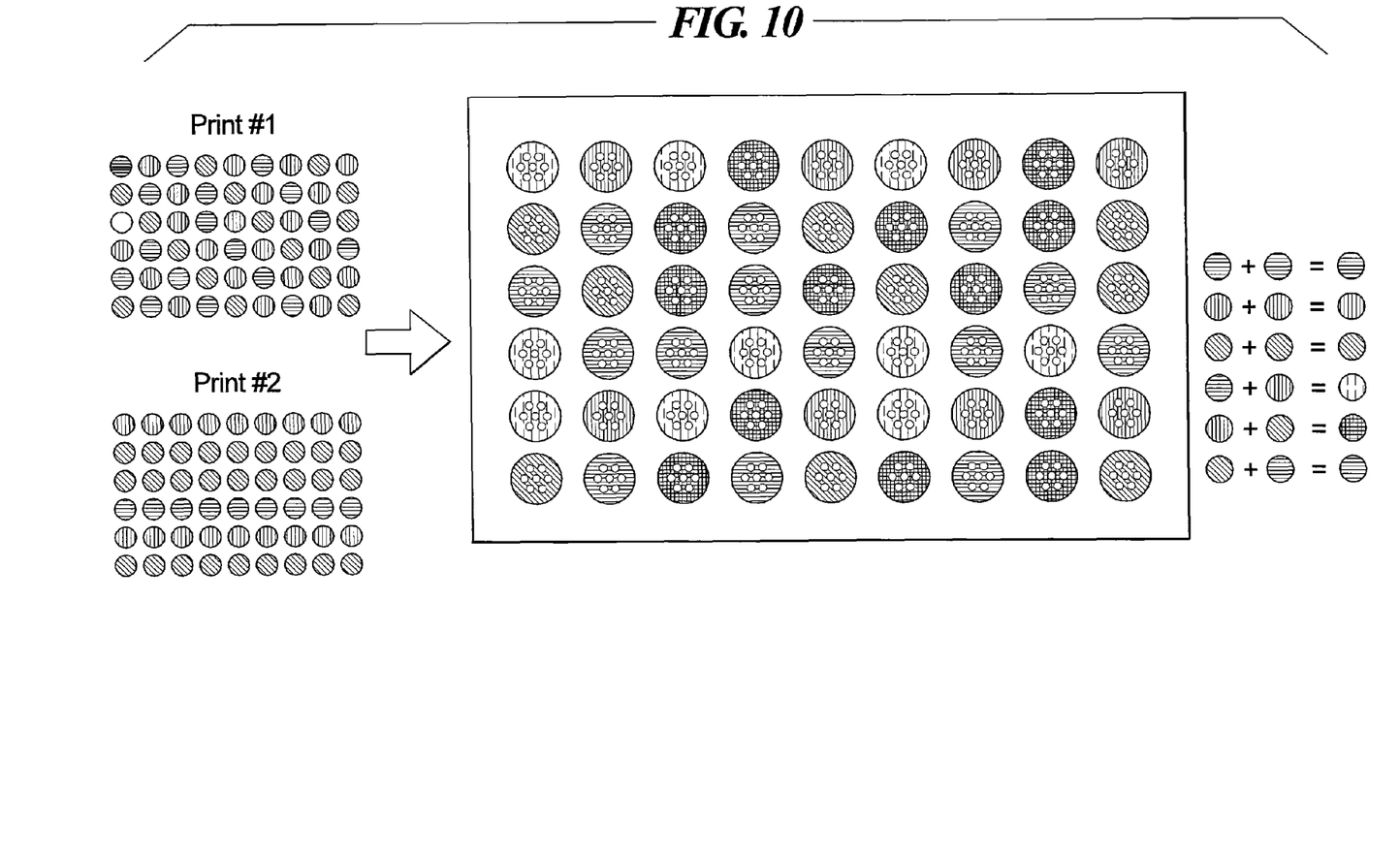
FIG. 10 is a schematic illustration of the use of the disclosed stencil to generate a combinatorial array of deposits.
Figure 11:
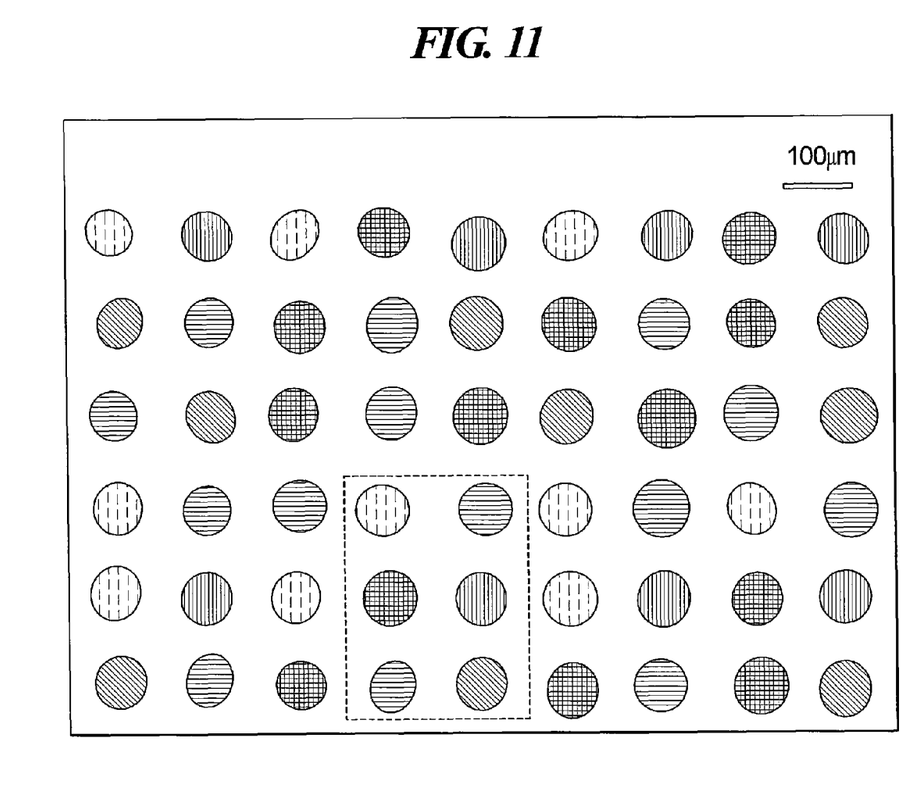
FIG. 11 is a photographic illustration of the embodiment in FIG. 10.
Figure 12:
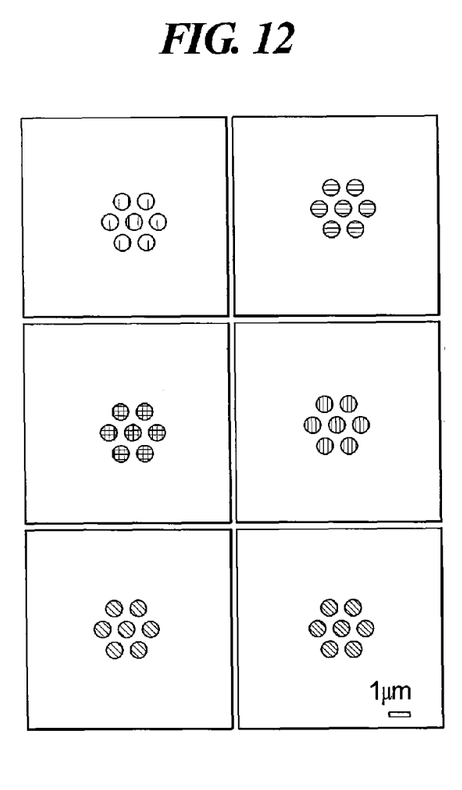
FIG. 12 is an enlarged photographic illustration of the embodiment in FIG. 11, particularly showing the six deposits in the broken line area.

As schematically illustrated in FIG. 10, two superimposed layers of multiplexed deposits may be obtained by simply adding a second depositing step after the first. The samples may be deposited by the inkjet printer disclosed herein or they may be deposited by other methods including, but not limited to, micro-contacting, quill-pen spotting, dip-pen lithography, etc. In the non-limiting example illustrated in FIG. 10-12, six different combinations of antibodies could be generated from an initial pool of three different antibodies, although more complicated combinatorial arrays may be generating by increasing the multiplexity of each array of deposits. Fluorescence images of the inkjet-printed spots corresponding to the three fluorophores were collected and merged to yield a pseudo-color image in FIG. 11. After parylene peel-off, superimposed arrays of deposits containing various combinations of antibodies may be obtained, as illustrated in FIG. 12.

Although purified proteins and antibodies were used in the examples disclosed herein, any desired substances, such as nucleic acids, cells and cell lysates, can be printed in combination or by itself. Arraying different combinations of biomolecular components using the disclosed process may be used in combinatorial screening of pharmaceutical compounds and responses of stem cells. The ability of the disclosed process to create combinatorial biomolecular nanoarrays may also facilitate the combinatorial study of synergistic and antagonistic properties of biomolecules in receptor-ligand interactions. Although two multiplexed arrays are used in the above-described example, the combinatorial array may also include one multiplexed array superimposed with a uniplexed array (e.g. bath-applied) or include more than two arrays superimposed with one another so long as at least one of the arrays are multiplexed.

It is to be understood, of course, that the disclosed methods and apparatus can be used to print a wide variety of materials, including the protein samples used in the above-discussed examples. Other biological or biomolecular substances suitable for use in the disclose methods and apparatus include, but certainly not limited to amino acids, peptides, oligopeptides, polypeptides, nucleotides, oligonucleotides, polynucleotides, saccharides, oligosaccharides, polysaccharides, lipids, carbohydrates, enzymes, steroids, metabolites, and derivatives thereof. Non-biological samples including inorganic, organic, metallic, and organometallic compounds may also be printed using the disclosed methods and apparatus.

While only certain embodiments have been set forth, alternative embodiments and various modifications will be apparent from the above descriptions to those skilled in the art. These and other alternatives are considered equivalents and within the spirit and scope of this disclosure.

What is claimed is:

1. An apparatus for printing an array of biomolecular deposits with nanoscale resolution on a substrate, comprising:
   a parylene stencil including an array of openings and at least one alignment mark, the parylene stencil being capable of being releasably attached to the substrate, each of the openings in the array having at least one dimension of no more than 200 nanometers; and
   a deposition printer aligned with the parylene stencil to print an array of biomolecular deposits under hydrated conditions on the substrate through the openings of the parylene stencil, the array of biomolecular deposits on the substrate having nanoscale resolution, the array of deposits from the printer being aligned with the array of openings in the stencil through the at least one alignment mark.

2. The apparatus of claim 1, further comprising an alignment device operatively associated with the stencil and the deposition printer to align the printer with the stencil.

3. The apparatus of claim 2, wherein the alignment device is a microscopic imaging device.

4. The apparatus of claim 2, wherein the alignment device is an atomic force microscope.

5. The apparatus of claim 1, wherein the average size of the deposits from the printer is greater than the average size of the openings in the stencil.

6. The apparatus of claim 5, wherein the average size of the deposits from the printer is at least two times greater than the average size of the openings in the stencil.

7. The apparatus of claim 1, wherein the deposition printer is an inkjet printer.

8. The apparatus of claim 7, wherein the openings have a depth/diameter ratio of no more than about 5.

9. The apparatus of claim 1, wherein the array of deposits are multiplexed.

10. A method for printing an array of biomolecular deposits with nanoscale resolution on a substrate, the method comprising:
    placing a parylene stencil over the substrate, the parylene stencil including an array of openings having at least one dimension of no more than 200 nanometers and at least one alignment mark;
    aligning a deposition printer to the parylene stencil through the at least one alignment mark;
    printing a first array of biomolecular deposits under hydrated conditions on the substrate through the array of openings in the parylene stencil by the deposition printer, the array of biomolecular deposits on the substrate having nanoscale resolution; and
    removing the parylene stencil from the substrate.

11. The method of claim 10, further comprising forming the parylene stencil prior to placing the parylene stencil over the substrate, the parylene stencil being formed by a method comprising:
    providing an etching mask including a first mask and a second mask over a parylene layer such that the second mask is positioned between the parylene layer and the first mask;
    forming an array of openings in the etching mask by a first etching process; and
    transferring the array of openings from the etching mask to the parylene layer by a second etching process to provide the parylene stencil, the second mask being more resistant to the second etching process than the first mask.

12. The method of claim 10, wherein the first array of deposits are multiplexed.

13. The method of claim 10, further including the step of printing a second array of deposits on the substrate through the array of openings by the printer.

14. The method of claim 13, wherein the second array of deposits are multiplexed.

15. The method of claim 13, wherein the first and second arrays of deposits are capable of interacting with each other.

16. A method for printing a combinatorial array of deposits on a substrate with nanoscale resolution, the method comprising:
    placing a parylene stencil over the substrate, the parylene stencil including an array of openings each having at least one dimension of no more than 200 nanometers;
    printing a first array of deposits on the substrate through the array of openings in the parylene stencil, the first array of deposits on the substrate having nanoscale resolution;
    printing a second array of deposits on the first array of deposits through the array of openings in the parylene stencil, at least one of the first and second arrays of deposits being multiplexed;
    generating the combinatorial array of deposits on the substrate by allowing the first array of deposits to interact with the second array of deposits; and
    removing the parylene stencil from the substrate.

17. The method of claim 16, wherein the interaction between the first and second multiplexed arrays is selected from the group consisting of chemical reactions, receptor-ligand bindings, enzyme-substrate interactions, interactions that generate fluorescence, chemiluminescence or color change, and combinations thereof.

18. The method of claim 16, wherein the first and second arrays of deposits are both multiplexed.

* * * * *